United States Patent
Heiland

(10) Patent No.: US 8,170,225 B2
(45) Date of Patent: May 1, 2012

(54) METHOD FOR ADAPTING A VIBRATION ISOLATION SYSTEM

(75) Inventor: Peter Heiland, Raunheim (DE)

(73) Assignee: Integrated Dynamics Engineering GmbH, Raunheim (DE)

(*) Notice: Subject to any disclaimer, the term of this patent is extended or adjusted under 35 U.S.C. 154(b) by 1096 days.

(21) Appl. No.: 12/030,806

(22) Filed: Feb. 13, 2008

(65) Prior Publication Data

US 2008/0197550 A1    Aug. 21, 2008

(30) Foreign Application Priority Data

Feb. 14, 2007 (DE) .................. 10 2007 007 911

(51) Int. Cl.
- G10K 11/16 (2006.01)
- G10K 11/178 (2006.01)
- F16F 15/03 (2006.01)
- G10K 1/00 (2006.01)
- F16F 15/00 (2006.01)

(52) U.S. Cl. ....... 381/71.1; 381/71.3; 181/207; 248/638

(58) Field of Classification Search .................. 381/71.1, 381/71.2, 71.3, 71.7; 181/200, 202, 207–209; 267/136, 140.15; 248/638

See application file for complete search history.

(56) References Cited

U.S. PATENT DOCUMENTS

| | | | | | |
|---|---|---|---|---|---|
| 2,994,400 | A | * | 8/1961 | Heller | 181/293 |
| 3,132,715 | A | * | 5/1964 | Dunsbee | 181/202 |
| 4,146,112 | A | * | 3/1979 | Usry | 181/202 |
| 4,527,371 | A | * | 7/1985 | Hagbjer | 52/309.16 |
| 4,733,750 | A | * | 3/1988 | Poirier et al. | 181/202 |
| 5,117,642 | A | * | 6/1992 | Nakanishi et al. | 62/115 |
| 5,130,948 | A | * | 7/1992 | Laukien et al. | 367/1 |
| 5,135,079 | A | * | 8/1992 | Shimazaki | 187/264 |
| 5,151,018 | A | * | 9/1992 | Clendenin et al. | 417/312 |
| 5,251,863 | A | * | 10/1993 | Gossman et al. | 248/550 |
| 5,331,567 | A | * | 7/1994 | Gibbons et al. | 703/1 |
| 5,407,330 | A | * | 4/1995 | Rimington et al. | 417/312 |
| 5,414,775 | A | * | 5/1995 | Scribner et al. | 381/71.2 |
| 5,502,869 | A | * | 4/1996 | Smith et al. | 15/326 |
| 5,508,518 | A | | 4/1996 | Kendall | |
| 5,692,053 | A | * | 11/1997 | Fuller et al. | 381/71.3 |
| 5,710,533 | A | * | 1/1998 | Pla et al. | 336/100 |
| 5,734,246 | A | * | 3/1998 | Falangas | 318/649 |
| 5,811,821 | A | * | 9/1998 | Alexander et al. | 250/440.11 |
| 5,823,467 | A | * | 10/1998 | Mathur | 244/1 N |

(Continued)

FOREIGN PATENT DOCUMENTS

JP    2001023881 A    7/1999

OTHER PUBLICATIONS

"European Office Action for International Application No. EP 08002729.5-1264", May 26, 2011, Publisher: European Patent Office, Published in: EP.

*Primary Examiner* — Edgardo San Martin
(74) *Attorney, Agent, or Firm* — DeMont & Breyer, LLC

(57) ABSTRACT

The invention relates to a method for adapting a vibration isolation system as well as to an arrangement with a vibration isolation system. By constructive measures in the environment of the vibration isolation system, particularly plane-parallel surfaces areas are avoided and thereby disturbing environmental influences are reduced.

10 Claims, 3 Drawing Sheets

U.S. PATENT DOCUMENTS

| | | | |
|---|---|---|---|
| 5,881,990 A * | 3/1999 | Kawamura | 248/638 |
| 5,917,919 A | 6/1999 | Rosenthal | |
| 6,002,987 A | 12/1999 | Kamiya et al. | |
| 6,119,808 A * | 9/2000 | Steedman et al. | 181/295 |
| 6,132,183 A * | 10/2000 | Li et al. | 417/363 |
| 6,226,075 B1 * | 5/2001 | Loopstra et al. | 355/76 |
| 6,371,240 B1 * | 4/2002 | Hayes et al. | 181/30 |
| 6,375,147 B1 * | 4/2002 | Radziun et al. | 248/638 |
| 6,449,934 B1 * | 9/2002 | Reimers et al. | 56/14.7 |
| 6,450,288 B1 | 9/2002 | Akiyama et al. | |
| 6,477,908 B1 | 11/2002 | Wakui | |
| 6,543,741 B1 * | 4/2003 | Li et al. | 248/638 |
| 6,810,989 B1 * | 11/2004 | Dantlgraber et al. | 181/202 |
| 6,825,635 B2 * | 11/2004 | Kato | 318/649 |
| 6,845,841 B2 * | 1/2005 | Smith et al. | 181/207 |
| 7,726,452 B2 * | 6/2010 | Kraner | 188/378 |
| 7,783,055 B2 * | 8/2010 | Barath et al. | 381/71.3 |
| 7,942,379 B2 * | 5/2011 | Heiland | 248/618 |
| 2003/0058417 A1 | 3/2003 | Nagahashi | |
| 2003/0168574 A1 * | 9/2003 | Watanabe et al. | 248/638 |
| 2004/0079173 A1 * | 4/2004 | Neely et al. | 73/862.333 |
| 2007/0235276 A1 * | 10/2007 | Heiland | 188/378 |
| 2007/0284794 A1 * | 12/2007 | Heiland | 267/140.11 |
| 2008/0106015 A1 * | 5/2008 | Fushimi et al. | 267/140.15 |

* cited by examiner

METHOD FOR ADAPTING A VIBRATION ISOLATION SYSTEM

FIELD OF THE INVENTION

The invention relates to a method for adapting a vibration isolation system as well as to a vibration isolation system.

BACKGROUND OF THE INVENTION

Vibration isolation systems are known. Thus for example, DE 698 17 750 T2 (Inventors Erik Loopstra, Peter Heiland) shows a vibration isolation system, which is designed for supporting a lithography device. Therein, the load to be supported, which typically comprises a table and components like production equipment placed thereon, is mounted on air bearings.

For improving the vibration isolation, so-called active vibration isolation systems provide sensors and actuators, by which a selective counteracting control is made possible. In doing so, actuators of the vibration isolation system are energized and act against vibrations, which may act on to the system from exterior or may be generated by the load to be supported.

Especially in the semiconductor industry, with increasing miniaturisation of the components, the requirements for such vibration isolation systems are steadily increasing.

It is particularly a matter of low-frequency adjusted (<1 Hz) vibration isolation systems to be used in the lithography, with steppers, immersion systems and the like, particularly also such which have a very low horizontal stiffness.

According to methods known from practical experience for designing vibration isolation systems, the features of the system are characterized independently from external conditions by measuring certain system parameters and features with defined mechanical scenarios. The feature being most important for a vibration isolation system is the isolation, thus the transfer function between floor vibration and mass vibration.

But also, impacts of sound waves on material are known (Casimir effect, see "An acoustic Casimir effect", Andres Larraza and Bruce Denardo, Phys. Lett. A 348, 151-155 !998)), which are of importance for vibration isolation systems.

These impacts are not or not sufficiently taken into consideration in case of known vibration isolation systems and of methods for designing vibration isolation systems respectively.

OBJECTS OF THE INVENTION

It is an object of the invention to provide a method for adapting a vibration isolation system, with which the isolation effect is improved.

Particularly, it is an object of the invention to reduce vibrations induced by environmental noise.

It is a further object of the invention to reduce perturbing effects, such as occurring from amplification of induced vibrations by adjoining walls.

SUMMARY OF THE INVENTION

The object of the invention is already achieved by a method for adapting a vibration isolation system as well as by a vibration isolation system according to one of the independent claims.

Pursuant to a method according to the invention for adapting a vibration isolation system, the environment, into which the vibration isolation system is or will be brought, is identified. In doing so, particularly, shape, material, mass and/or distance of the compounds, like walls, floors or sound sources, surrounding the vibration isolation system are determined.

On base of the determined boundary conditions, constructive measures for the vibration isolation system and/or the environment to reduce environmental impacts are identified and carried out. Therefore, the environment is taken into account, when designing the vibration isolation system. In doing so, the constructive measures may relate to the vibration isolation system as well as to the environment.

Particularly, it is provided to furnish the compounds surrounding the vibration isolation system, especially walls, at least in sections with soundproof material. By doing so, resonance effects, which affect the properties of the vibration isolation system, may be reduced.

When doing so, resonance volumes, which are particularly generated by plane-parallel surface areas, are detected and appropriate measures such as structuring the walls or furnishing with sound-proof material are carried out, in order to eliminate the resonance volumes.

It became clear that in a lot of cases the very application of a structure, for example a comb-shaped structure, is sufficient to reduce resonance effects to a level, which does not cause a noteworthy affect on the vibration isolation system.

Furthermore, the constructive measures comprise the elimination of plane-parallel surface-areas in the room itself and/or between the vibration isolation system and the room. It became clear that particularly a resonance volume, which is formed between the lower side of a vibration isolated mounted table and the floor, causes perturbing effects. Such a resonance volume may be eliminated in a particularly easy manner by structuring the floor and/or the table to be mounted vibration isolated.

It is further provided to furnish at least one component of the vibration isolation system with a structured surface for reducing any flow resistance. By doing so, particularly disturbances caused by air motions, for example by air conditioning, may be reduced. It is particularly provided to structure the base stage, on which for example a component to be isolated is arranged.

Furthermore, for reducing the disturbances by sound, it is provided that at least one loudspeaker is arranged in the surrounding of the vibration isolation system, which loudspeaker has an active control. Preferably, the active control is connected with at least one vibration sensor, which detects vibrations of a load to be isolated. By doing so, sound waves due to vibrations of the systems may be reduced by means of the active control of the loudspeaker.

Additionally or alternatively, the active control may be designed for reducing environmental sound.

Furthermore, the number of plane-parallel surface areas, which may cause resonance effects, may be reduced by roundings and/or openings in the base stage or in further components of the vibration isolation system.

It can be measured that the behaviour of vibration isolation systems depends on the surrounding geometry. Particularly, the isolation effect may be affected, if unfavourable factors of "external" components or items exist. Therefore, it became clear that a vibration isolation system is not exclusively characterized by factors inherent to the system. In fact, it depends on how the moving masses and surface areas act with respect to each other. A system near to a wall will act in another manner than one in a large room. But also the arrangement of surface areas of the vibration isolation system itself, relatively to fixed surface areas may induce forces (Casimir effect) in case of a noisy environment (semi-conductor production plants).

In case of motions of a system, the air space 5 between the base mass and the floor becomes larger and smaller depending how and with which frequency the system moves. If base mass and floor are plane-parallel, outwards only the path to the edge of the mass is left to the air. The construction of the lower side of the base mass has decisive influence on the air flow direction and intensity. When doing so, one should better stay with sound particle velocity variations or pressure variations and the analogy to acoustics. But the likeness of flow obtrude itself due to the low frequencies (<300 Hz).

Therefore, in the usual case of plane-parallel surface areas (base mass and floor), the property of the surface areas, as well as their distance from each other as well as the borders matter. In analogy to a Helmholtz resonator in acoustics (with which air oscillates in a bottleneck and the volume of the bottle acts as stiffness), here the frictional losses at the surface areas, as well as the involved volumes (at the exit surface areas and in the interior) may lead to an additional stiffness, which considerably affects the isolation properties of the system. Though, clear resonance-like effects may arise, which destroy or considerably lower the isolation effect. If the distance of the surface areas is large compared to the surface area itself, this effect becomes less meaningful. By using constructive measures in the base mass, this effect may be avoided. Additional openings in the middle of the surfaces or lowering the flow resistance. minimize the impact of this effect.

In other cases, the volume of the mass to be isolated itself is the source of air displacements. Since those masses may be quite voluminous, the masses of air moved together with the mass to be isolated are also not small. Therefore, the constructive forms in the surrounding of the system (and of the moved mass) become more important, because they may hinder the air flow.

This effect as well as the effect mentioned above may also be argued by means of the radiation resistance. If one imagines the plane-parallel tables and the mass of the system respectively (the assembly) to be a source of acoustic radiation, this sees a radiation impedance. This affects the source so that the source is affected in its movement. Therefore, it can be shown by means of this argumentation that the behaviour of the system may be influenced by constructive design of the environment.

So for example,
a) the surrounding walls may be designed with acoustically effective sound-insulating material so that the radiation resistance is similar to the resistance in the free field,
b) the surrounding walls may specifically formed in such a manner that the flow resistance is minimized, for example by curved surface area parts with low $c_w$ value,
c) it may be made sure by means of loudspeaker arrangements that the air flow is supported or stopped by means of active diaphragms. Such an active impedance adaptation is for example described in the following citations, whose content of disclosure is integrated by reference:
   D. Guicking and M. Wenzel: Adaptive Filter Concept for Active Control of Acoustic Wall Impedance. ASME Paper 86-WA/NCA-28, December 1986 (3 p.)
   M. Wenzel and D. Guicking: Konzept zur aktiven Reflexionsfaktorregelung mit adaptiven Digitalfiltern. In: Fortschritte der Akustik, DAGA '87 (Aachen). DPG-GmbH, Bad Honnef 1987, S. 505-508

Furthermore, the invention relates to minimizing the Casimir effect by constructive changes of surface areas against each other to minimize the directed induction of forces.

When qualifying and designing vibration isolation systems, the environment is involved.

The invention shows constructive measures around an existing isolation system (or in its proximate vicinity), which measures lead to the result that the feedback effect on it is minimized by
1. doing sound insulation measures at the surrounding walls
2. by favoring the air flow by means of forming the walls and the wall elements accordingly,
3. by actively influencing the acoustic impedance of the environment by active methods (e.g. speaker).

Or by a vibration isolation system, taking into account the above mentioned measures.

Furthermore, the invention shows constructive measure to lower force induction in case of noisy environments (Casimir effect), by minimizing plane-parallel surface areas with the environment.

Particularly, the invention relates to:
1. sound absorbing arrangements with porous, flow resistance afflicted, low-frequent effective absorbing substrates at the walls of the environment,
2. coated wall surface areas, which favour the air flow and have a low $c_w$ value,
3. speaker arrangements at the walls, which arrangements may influence the flow behaviour by control,
4. minimizing surface areas being plane-parallel with the environment by rounding, inserting of openings etc.

DETAILED DESCRIPTION

The invention shall be explained in more detail by means of the drawings FIG. 1 to FIG. 4 referring to schematically depicted embodiments.

Figure 1:
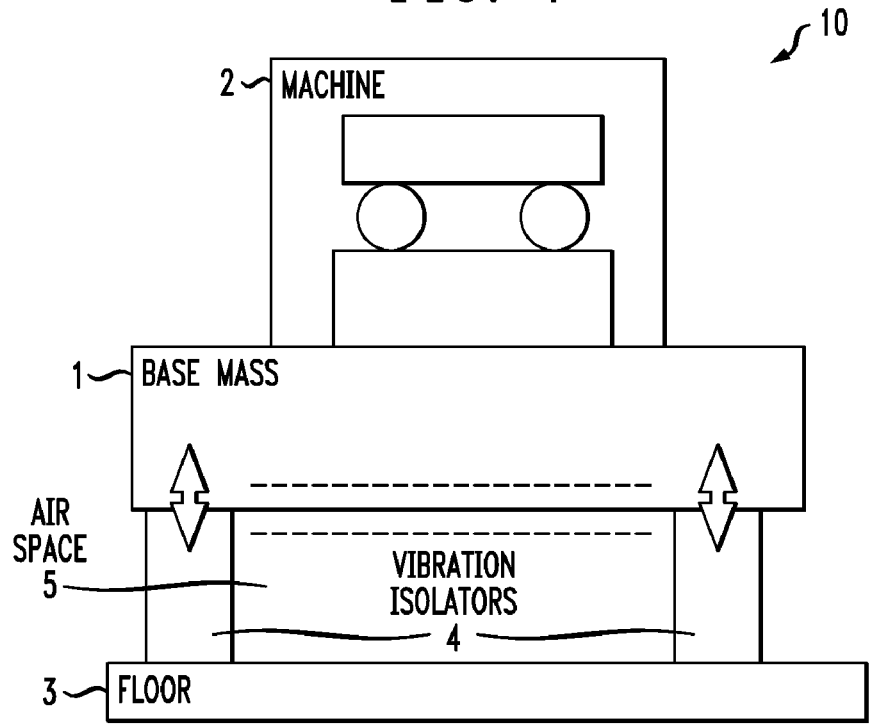
FIG. 1 depicts a first schematic diagram of the assembly of vibration isolation system 10.

FIG. 1 schematically shows the assembly of a vibration isolation system 10. The vibration isolation system 10 comprises a base mass 1, which is vibration isolated mounted on the floor 3 by vibration isolators 4. On the base mass 1, a machine 2 to be supported is arranged. Particularly due to the base mass 1 being oriented plane-parallelly to the floor 3, resonance effects may arise in the air between the base mass 1 and the floor.

Figure 2:
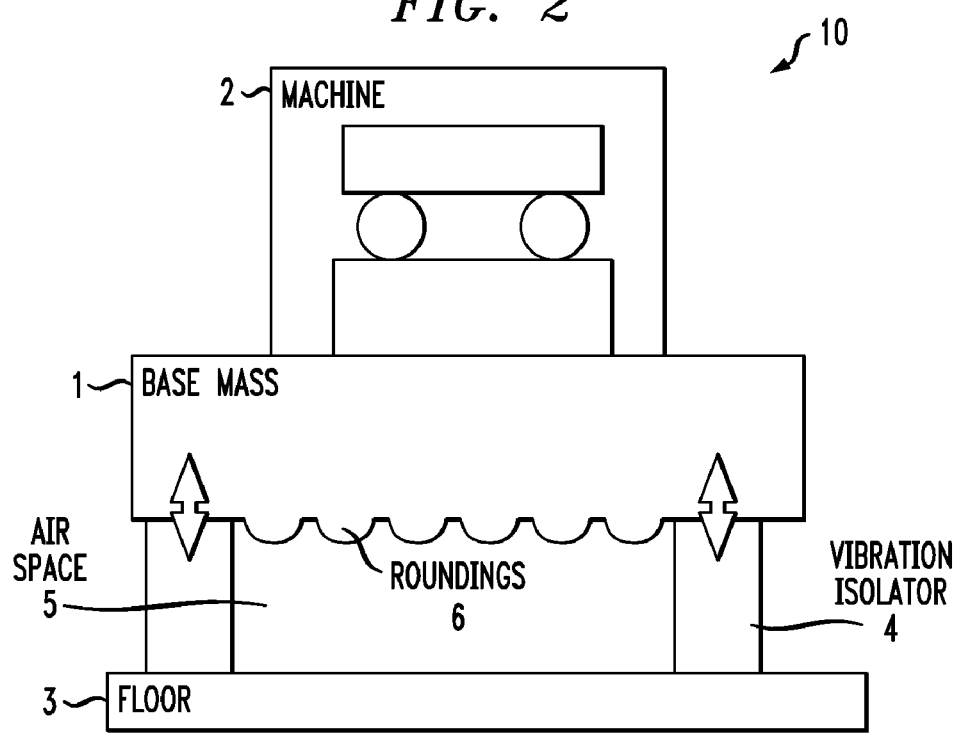
FIG. 2 depicts a second schematic diagram of the assembly of vibration isolation system 10.

With the vibration isolation system 10 according to FIG. 2, the lower side of the base mass 1 provides roundings 6, by which the plane-parallel arrangement is avoided. By doing so, resonance effects are avoided to a large extent.

Figure 3:
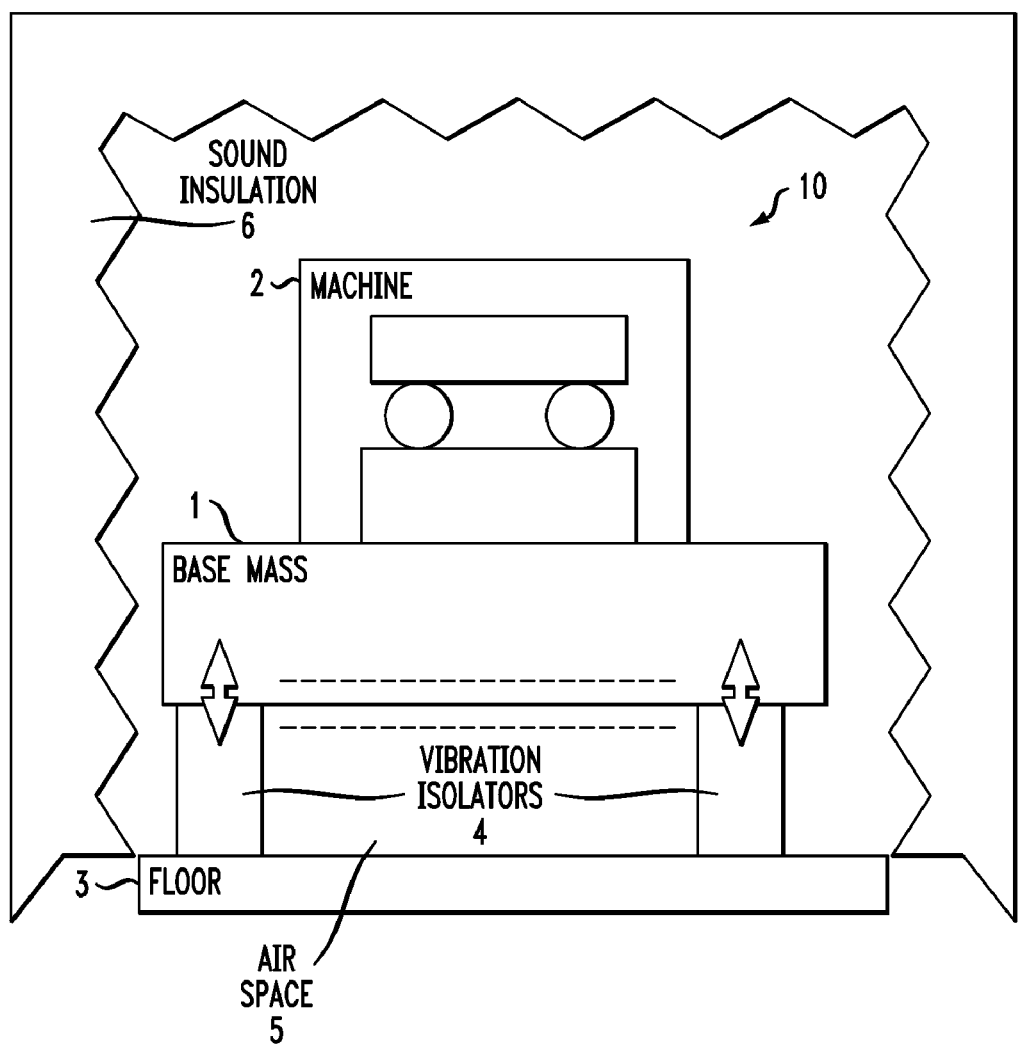
FIG. 3 depicts vibration isolation system 10 in a first environment.

With the vibration isolation system 10 according to FIG. 3, the walls of the environment are provided with a sound insulation 6.

Figure 4:
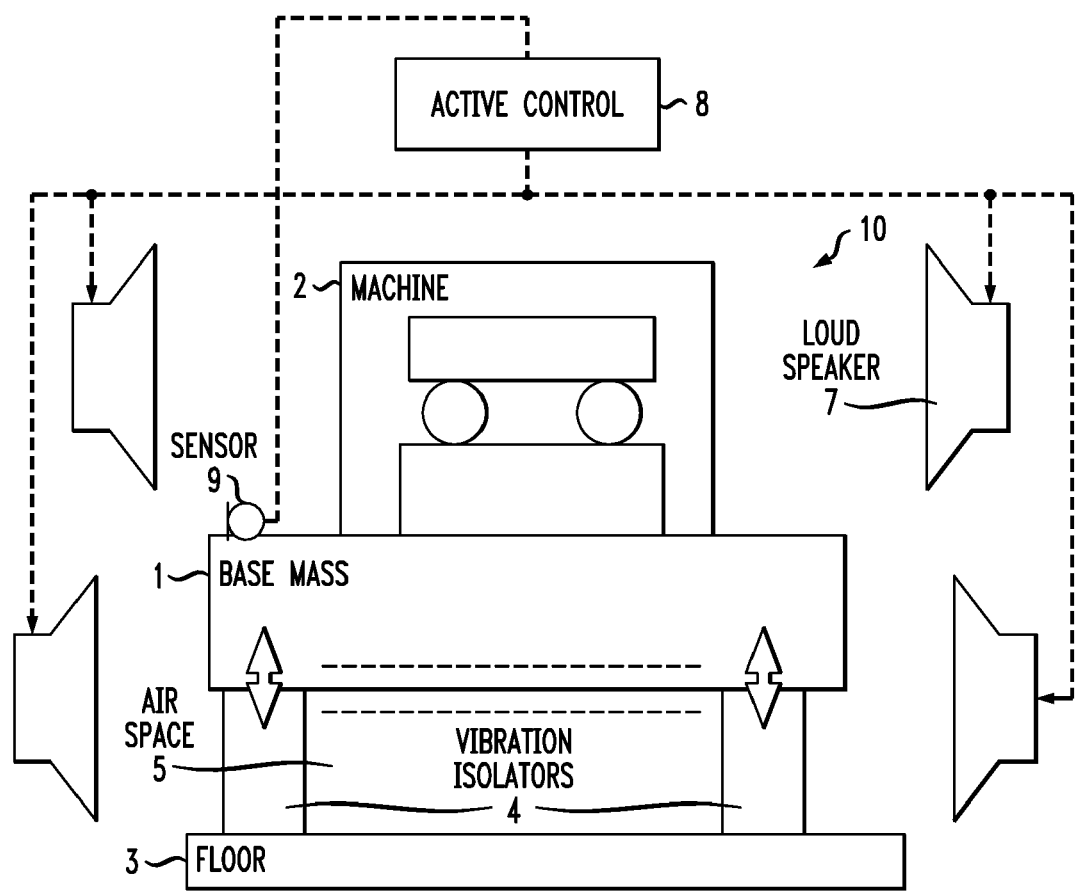
FIG. 4 depicts vibration isolation system 10 in a second environment.

In FIG. 4, the walls (not shown) of the environment of the vibration isolation system are provided with loudspeakers, which are connected to an active control 8. The active control 8 is, inter alia, connected to a sensor for detecting vibrations of the base mass. Thus, also sound waves caused by vibrations of the base mass are reduced by the active control. Thus, also disturbing reflexions of sound waves at the walls may be counteracted.

The invention claimed is:

1. A method for adapting a vibration isolation system, the method comprising:
   providing the vibration isolation system, wherein the vibration isolation system is a low-frequency adjusted, active vibration isolation system for lithography,
   determining the environment, into which the vibration isolation system is or will be installed,
   determining constructive measures for the vibration isolation system or the environment to reduce environmental influences on the basis of the determined environment, and
   carrying out constructive measures at the vibration isolation system or at the environment.

2. The method for adapting the vibration isolation system according to claim 1, wherein determining the environment, into which the vibration isolation system is or will be installed, comprises determining sound sources, vibration sources or resonance volumes.

3. The method for adapting the vibration isolation system according to claim 1, wherein carrying out constructive measures comprises controlling loudspeakers being arranged in the environment for active sound isolation.

4. The method for adapting the vibration isolation system according to claim 1, wherein carrying out constructive measures comprises eliminating plane-parallel surface areas.

5. An arrangement with an adapted vibration isolation system produced in accordance with the method of claim 1, wherein matter surrounding the adapted vibration isolation system is at least in sections provided with sound-insulating material.

6. An arrangement with an adapted vibration isolation system produced in accordance with the method of claim 1, wherein matter surrounding the adapted vibration isolation system is at least in sections structured.

7. An adapted vibration isolation system produced in accordance with the method of claim 1, wherein at least one component of the adapted vibration isolation system has a surface being structured for reducing air flow resistance.

8. An arrangement with an adapted vibration isolation system produced in accordance with the method of claim 1, wherein in the environment of the adapted vibration isolation system, at least one loudspeaker is arranged, which is connected with an active control.

9. An adapted vibration isolation system produced in accordance with the method of claim 1, wherein the adapted vibration isolation system has a base table, wherein at least in sections, the base table has structurings.

10. An adapted vibration isolation system produced in accordance with the method of claim 1, wherein at least 50% of the surface area of the lower side of the base table is structured.

* * * * *